(12) United States Patent
Roberts et al.

(10) Patent No.: US 10,925,366 B2
(45) Date of Patent: Feb. 23, 2021

(54) PROCESS FOR MAKING A CASE FOR A MOBILE DEVICE

(71) Applicant: Tech 21 Licensing Limited, Twickenham (GB)

(72) Inventors: Jason Roberts, Twickenham (GB); Wilhelm Marschall, London (GB); Benjamin Thorpe, Uxbridge (GB)

(73) Assignee: TECH 21 LICENSING LIMITED, Twickenham (GB)

(*) Notice: Subject to any disclaimer, the term of this patent is extended or adjusted under 35 U.S.C. 154(b) by 583 days.

(21) Appl. No.: 15/792,269

(22) Filed: Oct. 24, 2017

(65) Prior Publication Data
US 2018/0042348 A1 Feb. 15, 2018

Related U.S. Application Data

(60) Division of application No. 14/812,602, filed on Jul. 29, 2015, now abandoned, which is a continuation of application No. 14/586,256, filed on Dec. 30, 2014, now Pat. No. 9,526,320.

(30) Foreign Application Priority Data

Jan. 3, 2014 (GB) .................................. 1400079.8

(51) Int. Cl.
| | | |
|---|---|---|
| *A45C 11/00* | (2006.01) | |
| *A45F 5/00* | (2006.01) | |
| *H04B 1/3888* | (2015.01) | |
| *H05K 5/00* | (2006.01) | |
| *B29C 70/68* | (2006.01) | |
| *B29C 45/14* | (2006.01) | |

(52) U.S. Cl.
CPC ................ *A45C 11/00* (2013.01); *A45F 5/00* (2013.01); *H04B 1/3888* (2013.01); *H05K 5/0086* (2013.01); *A45C 2011/002* (2013.01); *A45C 2011/003* (2013.01); *B29C 45/14336* (2013.01); *B29C 70/68* (2013.01); *Y10T 428/1352* (2015.01)

(58) Field of Classification Search
CPC ............. A45C 11/00; A45C 2011/003; A45C 2011/002; A45C 13/36; A45F 5/00; H05K 5/0086; H05K 5/0091; H05K 5/02; H04B 1/3888; Y10T 428/1352; B29C 45/00; B29C 45/0001; B29C 45/0062; B29C 45/03; B29C 45/14; B29C 45/14008; B29C 45/14336; B29C 45/14811; B29C 45/14467; B29C 65/70; B29C 70/682; B29C 70/747; B29C 70/78; B29L 2009/00

See application file for complete search history.

(56) References Cited

U.S. PATENT DOCUMENTS

| | | | |
|---|---|---|---|
| 7,727,456 B2* | 6/2010 | Amano | B29C 45/14344 264/572 |
| 2012/0261289 A1* | 10/2012 | Wyner | A45C 11/00 206/320 |
| 2012/0325720 A1* | 12/2012 | Tages | H04B 1/3888 206/522 |
| 2013/0105354 A1* | 5/2013 | Wyner | B65D 81/1275 206/586 |
| 2013/0193006 A1* | 8/2013 | Bergreen | A45C 11/00 206/37 |
| 2013/0292269 A1* | 11/2013 | Tages | H04B 1/3888 206/37 |
| 2016/0234356 A1* | 8/2016 | Thomas | H05K 9/0069 |
| 2017/0303653 A1* | 10/2017 | Roberts | A45C 11/00 |

FOREIGN PATENT DOCUMENTS

WO    WO-2015029634 A1 *  3/2015  ............... B32B 5/20

OTHER PUBLICATIONS

Rogers, PORON® Urethane Foams, 2003, Pub. # 17-007, p. 1-2. (Year: 2003).*
Bayer, DUREFLEX® PS5400, 2010, p. 1-2. (Year: 2010).*

* cited by examiner

*Primary Examiner* — William P Fletcher, III
(74) *Attorney, Agent, or Firm* — Stephen J. Weyer, Esq.; Stites & Harbison, PLLC

(57) ABSTRACT

A method for manufacturing a case for a mobile device with a screen, includes using a band having a layer of flexible polymer as an insert mold or in a dual injection process, for applying discrete discontinuous and unconnected damping material on the layer of the flexible polymer of the band. The damping material is softer than the flexible polymer and has a plurality of integrally formed protrusions projecting inwardly from a substantial portion of the inner periphery of the band to engage with the mobile device. The protrusions are arranged such that, in use there is substantially no contact between the band and the device other than through the protrusions.

16 Claims, 2 Drawing Sheets

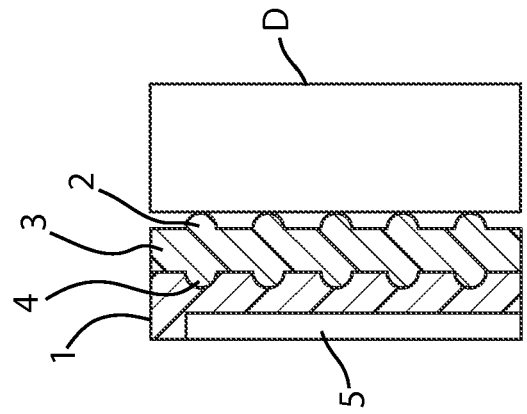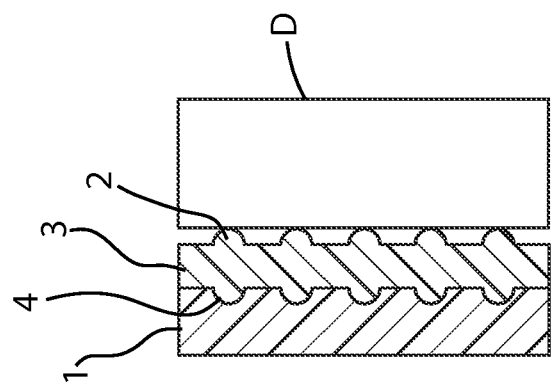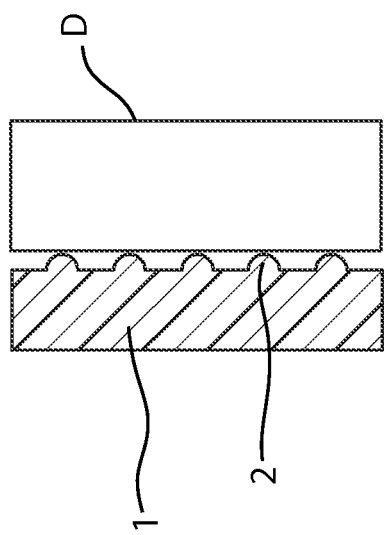

PROCESS FOR MAKING A CASE FOR A MOBILE DEVICE

CROSS-REFERENCE TO RELATED APPLICATION

This application is a divisional of U.S. patent application Ser. No. 14/812,602 filed on Jul. 29, 2015, now abandoned, which is a continuation of U.S. patent application Ser. No. 14/586,256 filed on Dec. 30, 2014, now U.S. Pat. No. 9,526,320, all herein incorporated by reference.

FIELD OF THE INVENTION

The present invention relates to a case for a mobile device with a screen such as a smart phone, tablet or E-reader.

BACKGROUND OF THE INVENTION

It is well known to make such cases of thermoplastic polyurethane (TPU) as this provides good durability for the case. It does not, however, provide good impact protection for the device as there is little dissipation of the impact and most of the energy of the impact is transferred to the device. Known impact resistant materials improve this to some extent.

The present invention aims to improve on this.

SUMMARY OF THE INVENTION

According to the present invention there is provided a case for a mobile device with a screen, the case comprising a band arranged to surround the edge of the device, the band comprising a layer of flexible polymer and a layer of a damping material which is softer than the flexible polymer provided within the flexible polymer layer, the damping material having a plurality of integrally formed protrusions projecting inwardly from a substantial portion of the inner periphery of the band to engage with the device, wherein the protrusions are arranged so that in normal use there is substantially no contact between the band and the device other than through the protrusions; wherein the protrusions are provided at least in the corner regions of the case.

Having protrusions in engagement with the majority of the periphery of the device reduces significantly the contact area between the device and the case to minimise energy transferred to the device. The flexible polymer outer layer absorbs impact energy and holds the shape of the case, while the softer material with the protrusions further absorbs and dissipates the remaining energy of the impact away from the device.

The contact with the protrusions is concentrated at vulnerable regions such as the corners of the device. Portions of the longer edges, or portions of edges where plugs sockets are present may have no protrusions. Alternatively, shorter protrusions may be provided along the longer edges of the case that will not contact the device in normal use but will provide some cushioning if the longer edges of the case are deflected inwardly.

The protrusions may have a number of configurations. They may, for example be circular or annular projections extending inwardly from the band. However, it has been found that the preferred configuration is one in which the protrusions are ribs extending generally across the depth of the band and have a curved cross-section when viewed in a section taken in the plane of the device. Preferably, the curved cross-section is substantially semi-circular. Experiments have shown that such a shape can absorb and dissipate high amounts of energy.

The case may consist only of the band. However, it may also have a rear wall engaging with the back of the device. It may further include a hinged cover to protect the screen.

The interface between the two materials may be planar. However, preferably, the damping material is provided with a plurality of outwardly projecting protrusions which are imbedded in the flexible polymer.

The protrusions between the two materials improve the cushioning and greatly increase energy absorption. The protrusions may have the same configuration as the inwardly projecting ribs. However, preferably, they are ribs which are rectangular in cross-section when viewed in a section taken in the plane of the device.

In order to further enhance impact protection, a layer of material harder than the flexible polymer material (measured on the Shore A hardness scale) may be provided outside of the flexible polymer material. This provides a hard outer shell to further spread the impact.

The flexible polymer may be TPE or TPU. The softer material is preferably a viscoelastic material or an impact damping or absorbing polymer.

The protrusions are preferably relatively robust in the sense that when dropped from 7 meters onto a hard surface, the protrusions will prevent contact between the device and the material between adjacent protrusions.

This may be achieved by having relatively large ribs where, preferably, each protrusion protrudes for a depth at least 0.5 mm (more preferably 1 mm) from the band, has a width greater than the depth and a pitch between adjacent protrusions which is greater than twice the width.

BRIEF DESCRIPTION OF THE DRAWINGS

Examples of cases in accordance with the present invention will now be described by reference to the accompanying drawings, in which:

FIG. 1 is a cross-section of a portion of a first case included for background interest only in contact with the device;

FIG. 2 is a similar view of a second case;

FIG. 3 is a similar view of a third case; and

DETAILED DESCRIPTION

Figure 4:
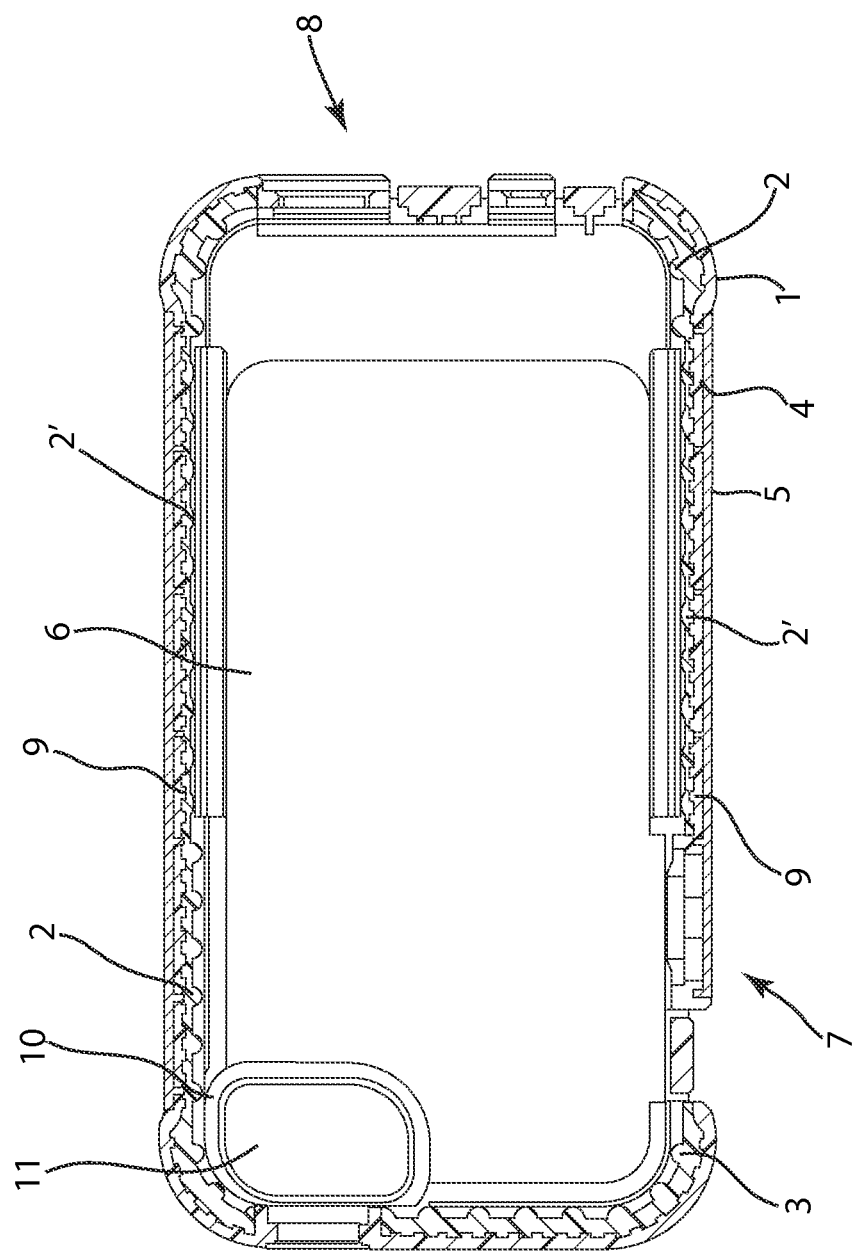
FIG. 4 is a cross-section in the plane of the device of a full case with the arrangement of FIG. 3.

FIG. 1 shows a small proportion of the case to illustrate the principle of the present invention. The whole case will run around the entire periphery of the device D.

The simplest design is typified in FIG. 1 which is a single material 1, in this case TPU (for example BASF Elastollan), which is provided with a number of inwardly extending ribs 2 which, as shown, have a semi-circular cross-section in the plane of the device and extend across the width of the band. The ribs in this example have a width of 2 mm, a depth of 1.5 mm and a spacing of 3 mm.

The same basic structure is observed in FIG. 2 which is in accordance with the invention, this time in a two part layer. The TPU forms the outer layer while an inner layer 3 formed in a dual injection process or as an insert mold is formed of a viscoelastic polymer which is softer than the TPU (for example, a TPE such as Kraiburg Thermolast K or a PU foam such as BASF Elastoflex). This time, the inwardly projecting ribs 2 are provided in the viscoelastic polymer layer 3. The viscoelastic polymer layer 3 also has a number of inwardly projecting ribs 4 which are embedded in the TPU layer 1.

The third case shown in FIG. 3 also in accordance with the invention adds to the second case of FIG. 2, a hard outer shell 5 which is a rigid polymer case (for example Bayer Makrolon). As shown in FIG. 3, this may only be present in certain regions where higher hardness is beneficial.

The manner in which the example shown in FIG. 3 is applied to a full case is shown with reference to FIG. 4. It will be appreciated that the examples of FIGS. 1 and 2 can be applied in the same manner, in The method of FIG. 2 omitting the outer shell 5, and in The method of FIG. 1 with all of the case being formed of a single layer of thermoplastic polymer 1.

In the full case shown in FIG. 4, the TPU material 1 forms the bulk of the casing including the majority of the rear face 6. This is lined with a layer of viscoelastic polymer 3 which extends across a portion of the rear face 6 and up the sides of the majority of the case. There are regions 7 and 8 in FIG. 4 where the viscoelastic polymer is absent and the only material is the TPU so as to allow access to the buttons in the side of the device in region 7 and the ports for the charger plug and headphone jack in region 8. The ribs 2 are present particularly at the corners of the device to provide maximum cushioning in these regions. Running along the majority of each side of the case are truncated ribs 2' so that the case does not contact the device in these regions during normal use thereby further isolating the sides from impact on the screen.

The interface between the TPU 1 and viscoelastic polymer 5 has a plurality of rectangular ribs 9 protruding inwardly from the viscoelastic polymer 5. These ribs 9 have a rectangular profile in cross-section, the width of which is at least twice their depth.

The case is completed by the rigid polymer layer 5 which extends along the majority of each side of the case. There is also a ring of rigid polymer 10 surrounding an orifice 11 which provides a window for the rear facing camera, sensor and LED flash.

As can be seen from FIG. 4, the casing is designed to provide maximum cushioning in the corner regions. However, along the long side portions, the case is largely held away from the device and has enhanced rigidity afforded by the rigid polymer layer 5.

The invention claimed is:

1. A method for manufacturing a case for a mobile device with a screen, the case comprising a band arranged to surround the edge of the device, the method comprising:
   supplying the band comprising a layer of flexible polymer; and
   in either an insert molding process or in a dual injection process, applying discrete discontinuous and unconnected damping material on the layer of the flexible polymer of the band, the damping material being softer than the flexible polymer (as measured on the Shore A hardness scale), the damping material having a plurality of integrally formed protrusions projecting inwardly from a substantial portion of the inner periphery of the band to engage with the device,
   wherein the protrusions are arranged such that, in use there is substantially no contact between the band and the device other than through the protrusions;
   wherein the protrusions are provided at least in the corner regions of the case, and
   wherein there are regions around the band where the damping material is absent such that the damping material does not extend continuously around the band and the only material is the layer of flexible polymer.

2. The method of claim 1, wherein there are no protrusions, or shorter protrusions along portions of the longer edges of the case such that the case will not contact the device in these regions in use.

3. The method of claim 1, wherein the protrusions are ribs extending generally across the depth of the band and have a curved cross-section when viewed in a section taken in the plane of the device.

4. The method of claim 3, wherein the curved cross-section is substantially semi-circular.

5. The method of claim 1, wherein the damping material is provided with a plurality of outwardly projecting protrusions which are imbedded in the flexible polymer material.

6. The method of claim 5, wherein the outwardly projecting protrusions are ribs which are rectangular in cross-section when viewed in a section taken in the plane of the device.

7. The method of claim 1, wherein a layer of material harder than the flexible polymer material is provided outside of the flexible polymer material.

8. The method of claim 7, wherein the layer of material harder than the flexible polymer material has a hardness range of 75 Shore A to 85 Shore D.

9. The method of claim 1, wherein the flexible polymer layer has a Shore A hardness range of 70 to 90.

10. The method of claim 1, wherein the layer of damping material has a Shore A hardness range of 0 to 70.

11. The method of claim 1, wherein each protrusion protrudes for a depth at least 0.5 mm from the band, has a width greater than the depth and a pitch between adjacent protrusions which is greater than twice the width.

12. The method of claim 11, wherein the depth of each protrusion is at least 1 mm.

13. The method of claim 1, further comprising a rear face defined by the band and wherein the damping material is confined to the band and is not present on the rear face.

14. The method of claim 1, wherein the discrete discontinuous and unconnected damping material is inseparable from the layer of flexible polymer.

15. The method of claim 1, wherein the damping material is bonded to the layer of flexible polymer.

16. The method of claim 14, wherein the band is a single piece formed from the layer of flexible polymer with the discrete discontinuous and unconnected damping material.

* * * * *